(12) United States Patent
Kshirsagar et al.

(10) Patent No.: US 9,733,281 B2
(45) Date of Patent: Aug. 15, 2017

(54) VOLTAGE SENSOR SYSTEM

(71) Applicant: EATON CORPORATION, Cleveland, OH (US)

(72) Inventors: Abhijeet Vikram Kshirsagar, Pune (IN); Mark Allan Juds, New Berlin, WI (US); Gayatri Shashikant Dharne, Pune (IN)

(73) Assignee: EATON CORPORATION, Cleveland, OH (US)

( * ) Notice: Subject to any disclaimer, the term of this patent is extended or adjusted under 35 U.S.C. 154(b) by 303 days.

(21) Appl. No.: 14/583,880

(22) Filed: Dec. 29, 2014

(65) Prior Publication Data
US 2016/0187390 A1    Jun. 30, 2016

(51) Int. Cl.
G01R 31/02 (2006.01)
G01R 19/00 (2006.01)
G01R 27/26 (2006.01)
G01R 15/16 (2006.01)
G01R 29/12 (2006.01)

(52) U.S. Cl.
CPC ....... *G01R 19/0084* (2013.01); *G01R 15/165* (2013.01); *G01R 19/0046* (2013.01); *G01R 29/12* (2013.01)

(58) Field of Classification Search
CPC ......... G01R 31/02; G01R 19/00; G01R 27/26
USPC .. 324/72, 126, 452–458, 632, 658–663, 678
See application file for complete search history.

(56) References Cited

U.S. PATENT DOCUMENTS

| 6,307,385 | B1 | 10/2001 | Tardif et al. | |
| 6,636,053 | B1* | 10/2003 | Gozzini | G01D 5/24 324/658 |
| 8,653,822 | B1 | 2/2014 | Dea | |
| 2004/0189312 | A1 | 9/2004 | Yasuda et al. | |
| 2006/0220099 | A1* | 10/2006 | Kikuchi | H01L 29/402 257/315 |
| 2009/0319210 | A1 | 12/2009 | Yanagisawa | |

FOREIGN PATENT DOCUMENTS

WO    2012/139648 A1    10/2012

OTHER PUBLICATIONS

European Patent Office, "International Search Report and Written Opinion" (for corresponding application PCT/US2015/057451), Jan. 29, 2016, 14 pp.

* cited by examiner

*Primary Examiner* — Tung X Nguyen
*Assistant Examiner* — Neel Shah
(74) *Attorney, Agent, or Firm* — Eckert Seamans; Nathaniel Wilks; Grant Coffield

(57) ABSTRACT

A voltage sensor system for sensing voltage in a conductor, the voltage sensor system including a first plate, a first electrode disposed a first distance away from the first plate, a second plate, a second electrode disposed a second distance away from the second plate, a control unit structured to control one of the first plate and the second plate to be grounded and the other of the first plate and the second plate to be electrically floating, and a differential amplifier electrically connected to the first electrode and the second electrode and being structured to output an output voltage that is proportional to a difference in voltage between the first electrode and the second electrode.

19 Claims, 5 Drawing Sheets

VOLTAGE SENSOR SYSTEM

CROSS-REFERENCE TO RELATED APPLICATION

This application is related to co-pending U.S. patent application Ser. No. 14/583,882 filed on Dec. 29, 2014, entitled "VOLTAGE SENSOR HOUSING AND ASSEMBLY INCLUDING THE SAME", the entirety of which is incorporated herein by reference.

BACKGROUND

Field

The disclosed concept relates generally to sensors systems, and more particularly, to voltage sensor systems.

Background Information

Voltage sensors are used by power utilities to measure the voltage of transmission lines, distribution lines, and busbars. The voltage measurements from these voltage sensors may be used as inputs to a variety of devices such as circuit interrupters. Some types of voltage sensors are inductive voltage transformers (IVTs), capacitive voltage transformers (CVTs), and resistive dividers (RDs).

Some or all of IVTs, CVTs, and RDs suffer from the following limitations: a single sensor cannot measure AC and DC voltage; these sensors require direct wiring to the circuit being measured; these sensors cannot withstand normal and abnormal fluctuations in voltage; these sensors have poor stability over time and temperature; there is power loss associated with these sensors; and some types of these sensors require a special cooling system to remove heat generation due to high power losses. A voltage sensor that can reduce or eliminate these limitations would be desirable.

There is therefore room for improvement in voltage sensors.

SUMMARY

These needs and others are met by embodiments of the disclosed concept, which are directed to a voltage sensor system that includes a first plate and corresponding first electrode, and a second plate and corresponding second electrode. One of the first and second plates is controlled to be grounded and the other of the first and second plates is controlled to be electrically floating.

In accordance with one aspect of the disclosed concept, a voltage sensor system for sensing voltage in a conductor comprises: a first plate; a first electrode corresponding to and disposed a first distance away from the first plate; a second plate; a second electrode corresponding to and disposed a second distance away from the second plate; a control unit structured to control one of the first plate and the second plate to be grounded and the other of the first plate and the second plate to be electrically floating; and a differential amplifier electrically connected to the first electrode and the second electrode and being structured to output an output voltage that is proportional to a difference in voltage between the first electrode and the second electrode.

In accordance with another aspect of the disclosed concept, a voltage sensor system for sensing voltages in a three phase power system including a first conductor corresponding to a first phase, a second conductor corresponding to a second phase, and a third conductor corresponding to a third phase comprises: a first sensor system corresponding to the first conductor; a second sensor system corresponding to the second conductor; and a third sensor system corresponding to the third conductor, wherein each of the first, second, and third sensor systems includes: a first plate; a first electrode disposed a first distance away from the first plate; a second plate; a second electrode disposed a second distance away from the second plate; a control unit structured to control one of the first plate and the second plate to be grounded and the other of the first plate and the second plate to be electrically floating; and a differential amplifier electrically connected to the first electrode and the second electrode and being structured to output an output voltage that is proportional to a difference in voltage between the first electrode and the second electrode.

In accordance with another aspect of the disclosed concept, a method of sensing voltage in a conductor comprises: providing a first plate; providing a first electrode corresponding to and disposed a first distance away from the first plate; providing a second plate; providing a second electrode corresponding to and disposed a second distance away from the second plate; controlling one of the first plate and the second plate to be grounded and the other of the first plate and the second plate to be electrically floating; and sensing a voltage difference between the first electrode and the second electrode.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
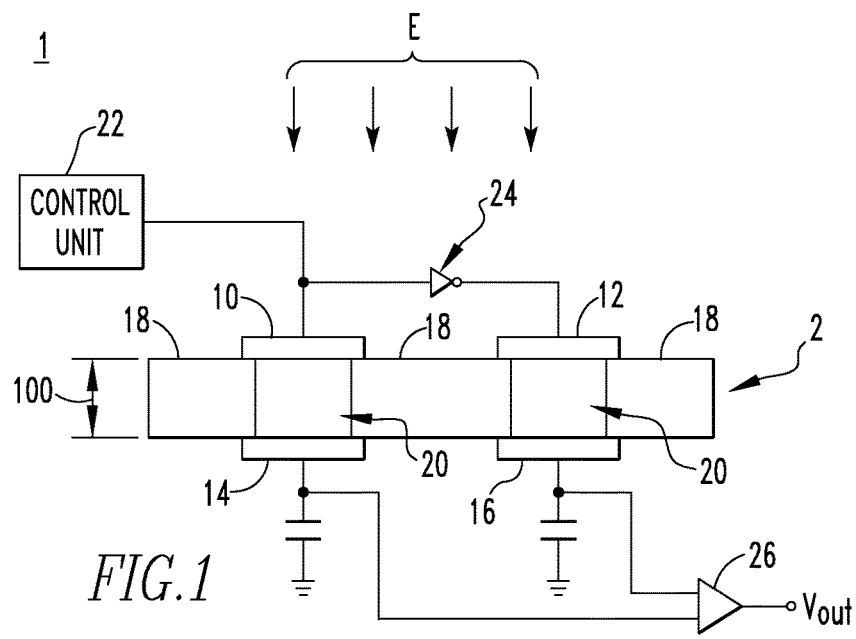
FIG. 1 is a side view of a sensor system in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "electrically floating" shall mean that a component is not electrically connected to a ground or other common reference point in an electrical system.

Figure 2:
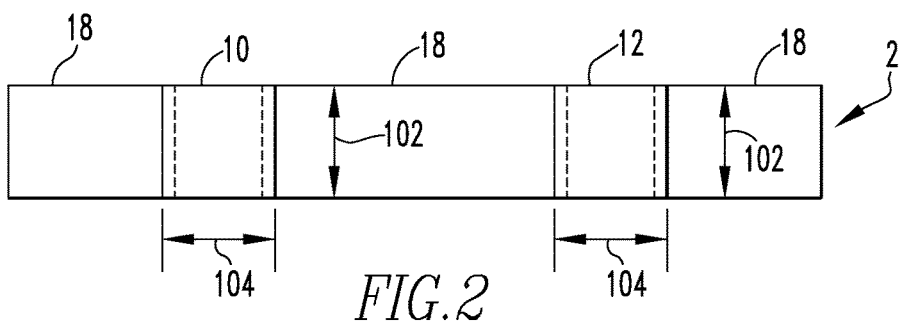
FIG. 2 is a top view of a sensor from the sensor system of FIG. 1.
Figure 3:
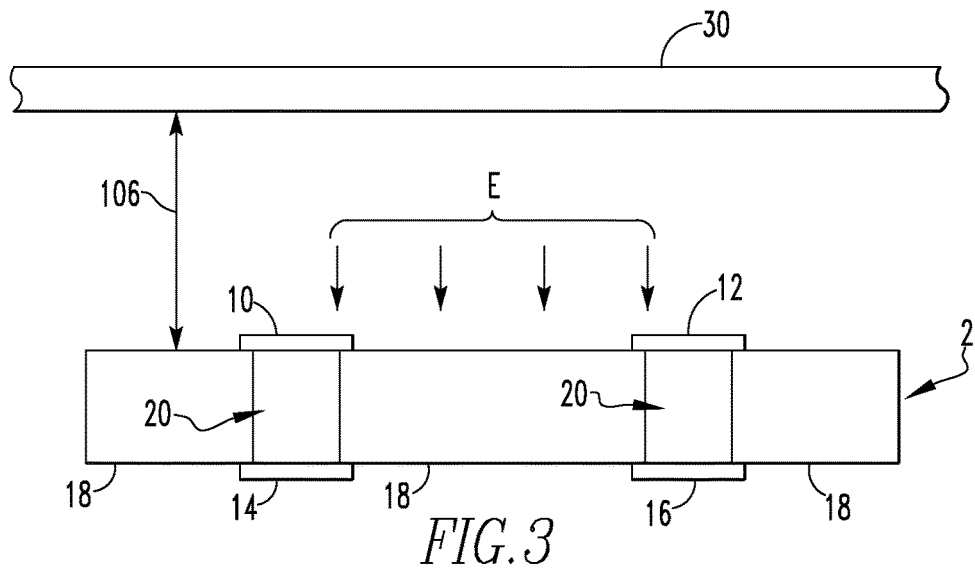
FIG. 3 is a side view of the sensor system of FIG. 1 employed in conjunction with a conductor.

FIG. 1 is a side view of a sensor system 1 in accordance with an example embodiment of the disclosed concept. FIG. 2 is a top view of a sensor 2 from the sensor system of FIG. 1. FIG. 3 shows the sensor system 1 of FIG. 1 employed in conjunction with a conductor 30. The circuitry associated with the sensor 2 is shown in FIG. 1, but is not shown in FIGS. 2 and 3. However, it is contemplated that such circuitry may be employed with the sensors 2 shown in FIGS. 2 and 3.

Referring to FIG. 1, the sensor system 1 includes the sensor 2 and associated circuitry. The sensor 2 includes a first plate 10, a second plate 12, a first electrode 14, and a second electrode 16. The sensor 2 also includes spacers 18 that separate the first plate 10 from the first electrode 14 and the second plate 12 from the second electrode 16. The first plate 10, the second plate 12, the first electrode 14, and the second electrode 16 are made of conductive material (e.g., copper, other metallic materials, other suitable conductive materials, etc.), and the spacers 18 are made of a non-conductive material. Air gaps 20 are disposed between the first plate 10 and the first electrode 14 and the second plate 12 and the second electrode 16.

In some example embodiments of the disclosed concept the plates 10,12 and the electrodes 14,16 are substantially square and have an equal length 102 and width 104 (see FIG. 2). However, the disclosed concept is not limited thereto. It is contemplated that the plates 10,12 an the electrodes 14,16 may have any suitable shape. It is also contemplated that the plates 10,12 and the electrodes 14,16 may each have different shapes and sizes. However, the plates 10,12 will generally have the same area as each other. It is contemplated that the electrodes 14,16 may be smaller than the plates 10,12.

The circuitry associated with the sensor 2 includes a control unit 22, an inverting buffer 24, a differential amplifier 26, and any other suitable circuit components such as capacitors and resistors. The first plate 10 and the second plate 12 are electrically coupled to the control unit 22. In more detail, an output of the control unit 22 is electrically coupled to the first plate 10. The output of the control unit 22 is also electrically coupled to the second plate 12 via the inverting buffer 24. The control unit 22 has two states. In the first state, the control unit 22 electrically connects the first plate 10 to ground and leaves the second plate 12 electrically floating. In the second state, the control unit 22 electrically connects the second plate 12 to ground and leaves the first plate 10 electrically floating. The inverting buffer 24 electrically connected between the first plate 10 and the second plate 12 ensures that when one of the first plate 10 and the second plate 12 is grounded, the other is electrically floating.

In FIG. 1, an electric field E incident on the sensor is shown. When the control unit 22 is in the first state and the first plate 10 is electrically connected to ground, the first electrode 14 is shielded from the electric field E. The second plate 12, which is electrically floating, does not shield the second electrode 16, so the electric field E passes through the second plate 12 and induces a voltage in the second electrode 16. The induced voltage is directly proportional to the magnitude of the electric field E.

The first and second electrodes 14,16 are electrically connected to a differential amplifier 26. The differential amplifier 26 outputs an output voltage $V_{OUT}$ that is directly proportional to the difference between the voltage of the first electrode 14 and the voltage of the second electrode 16.

The electric field E may be an electric field that is created by current running through a conductor 39 (see FIG. 3) such as a power distribution line or busbar. The magnitude of the electric field E is proportional to the magnitude of the voltage in the conductor. Thus, by measuring the voltage $V_{OUT}$, the magnitude of the voltage in the conductor 30 can be determined.

When the electric field E is fluctuating, as it would be when alternating current is flowing through the conductor 30, the control unit 22 may remain in the first state, remain in the second state, or switch between the first and second states. On the other hand, when the electric field E is constant, as it would be when direct current is flowing through the conductor 30, the control unit 22 switches between the first and second states. The reason for switching between the first and second states is that over time a charge will build up on one of the first and second plates 10,12 that is electrically floating, which can cause the output voltage $V_{OUT}$ to be inaccurate. Switching between the first and second states allows the first and second plates 10,12 to each be periodically electrically connected to ground. This allows charge to be pumped into the circuitry (e.g., the differential amplifier) on a regular interval. Since a DC field is not changing, there would be no change in induced charges in the electrodes 14,16 to measure. Switching keeps charges flowing, thus allowing the sensor 2 to measure DC voltage in the conductor 30.

The sensitivity of the sensor system 1 to measure voltage in the conductor 30 is based in part on the length of the gap 100 between the plates 10,12 and electrodes 14,16, the area of the electrodes 14,16, and the distance 106 between the conductor 30 and the sensor 2. When the sensor system 1 is used in different voltage ranges, it may be suitable to adjust the sensitivity of the sensor system 1 to provide output results that are suitable for its application. For example, higher sensitivity may be desired at lower voltage ranges and lower sensitivity may be desired at higher voltage ranges. Since the sensitivity of the sensor system 1 can be adjusted by changing the distance 106 between the conductor 30 and the sensor 2, the sensitivity of the sensor system 1 can be changed without physically changing the sensor 2, thus extending the range of voltages one sensor system 1 can be used to sense.

In one example embodiment of the disclosed concept, the length of the gap 100 between the plates 10,12 and electrodes 14,16 is about 10 mm, the area of the electrodes 14,16 is about 100 mm², and the distance 106 between the conductor 30 and the sensor 2 is about 3 m. In another example embodiment of the disclosed concept, the length of the gap 100 between the plates 10,12 and electrodes 14,16 is about 20 mm, the area of each electrode 14,16 is about 225 mm², and the distance 106 between the conductor 30 and the sensor 2 is about 4 m. In yet another example embodiment of the disclosed concept, the length of the gap 100 between the plates 10,12 and electrodes 14,16 is about 30 mm, the area of each electrode 14,16 is about 400 mm², and the distance 106 between the conductor 30 and the sensor 2 is about 5 m. In still another example embodiment of the disclosed concept, the area of each electrode 14,16 is about 1 inch and the length of the gap 100 between the plates 10,12 and electrodes 14,16 is about 5 mm. In some other embodiments of the disclosed concept, the distance between the conductor 30 and the sensor 2 is about 1 inch, about 3 inches, or about 6 inches. It is noted that the aforementioned areas and distances are examples and the disclosed concept is not limited thereto. Any suitable length of the gap 100 between the plates 10,12 and electrodes 14,16, area of the electrodes 14,16, and distance 106 between the conductor 30 and the sensor 2 may be employed without departing from the scope of the disclosed concept. Gap distances are inversely proportional to the dielectric constant of the material in the gap. Both the gap distance and the gap dielectric material can be optimized for manufacturing, cost, size, and sensitivity as needed.

Figure 4:
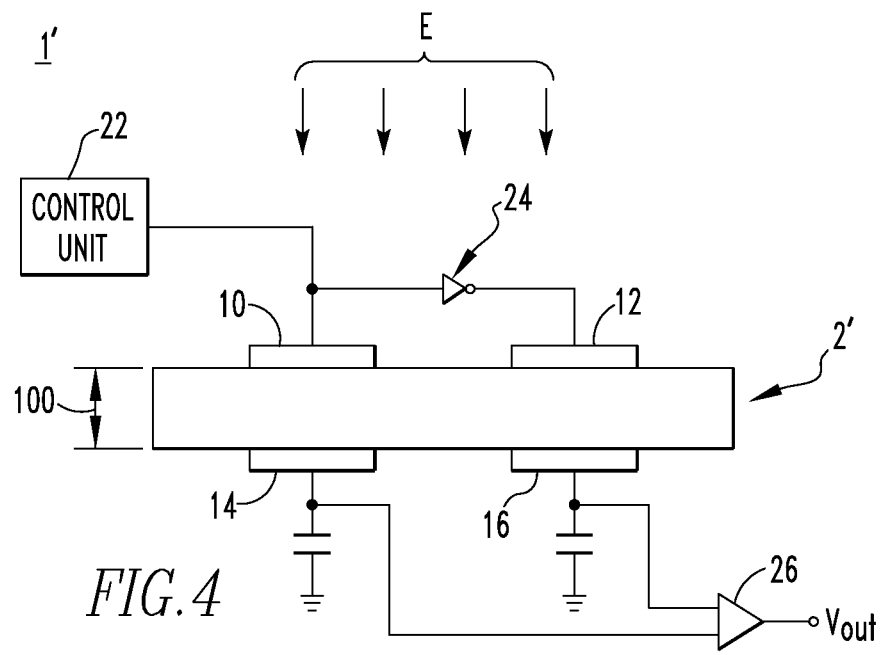
FIG. 4 is a side view of a sensor system in accordance with another example embodiment of the disclosed concept.
Figure 5:
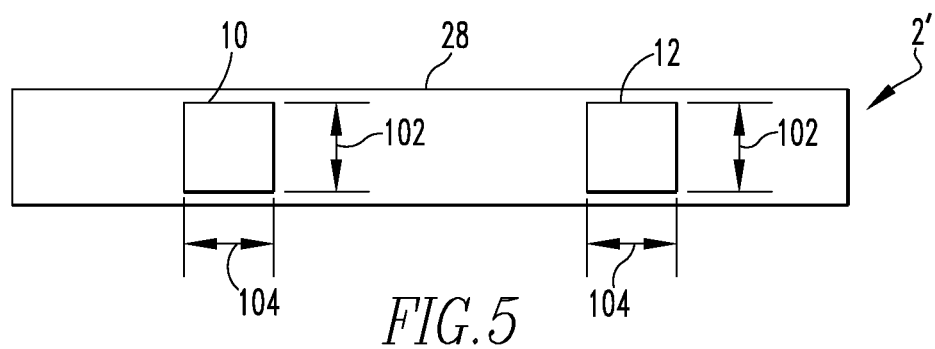
FIG. 5 is a top view of a sensor from the sensor system of FIG. 4.

FIG. 4 is a side view of a sensor system 1' in accordance with another example embodiment of the disclosed concept. FIG. 5 is a top view of a sensor 2' from the sensor system 1' of FIG. 4.

The sensor system 1' and sensor 2' of FIGS. 4 and 5 are similar to the sensor system 1 and sensor 2 of FIGS. 1 and 2. However, rather than including spacers 18 and air gaps 20, the sensor 2' of FIGS. 4 and 5 includes a dielectric spacer 28 that is disposed between the first plate 10 and the first electrode 14 and is also disposed between the second plate 12 and the second electrode 16. The dielectric spacer 28 may be made of any suitable dielectric material such as, without limitation, polymethyl methacrylate (PMMA). However, it is contemplated that any non-electrically conductive dielectric material with a sufficiently high dielectric breakdown strength may be used, such as, without limitation, plastics, elastomers, ceramics, dielectric liquids, and epoxies.

It is contemplated that the sensor system 1' and sensor 2' of FIGS. 4 and 5 may be used to measure the voltage in the conductor 30 (see FIG. 3), similar to how the sensor system 1 and sensor 2 of FIGS. 1 and 2 are used to measure the voltage in the conductor 30.

Figure 6:
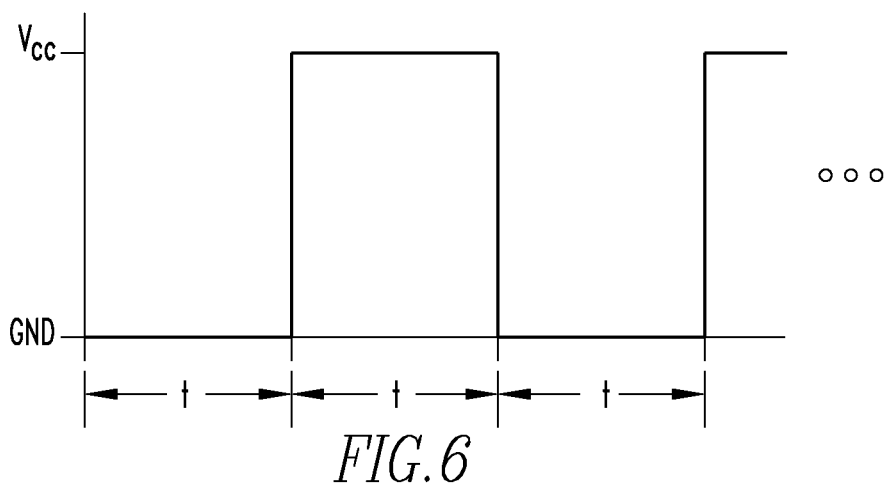
FIG. 6 is an example of a square wave used in conjunction with the sensor systems of FIGS. 1 and 4.

FIG. 6 is a plot of an example square wave that may be output by the control unit 22. As previously noted, the control unit 22 has a first state in which the control unit 22 electrically connects the first plate 10 to ground and leaves the second plate 12 electrically floating, and a second state in which the control unit 22 electrically connects the second plate 12 to ground and leaves the first plate 10 electrically floating.

When the control unit 22 outputs the square wave of FIG. 6, the control unit 22 first outputs a ground signal GND, which corresponds to the first state of the control unit 22. In more detail, the ground signal GND electrically connects the first plate 10 to ground. Since the inverting buffer 24 is electrically connected between the control unit 22 and the second plate 12, the output of the control unit 22 is inverted, changing it from a ground signal GND to a floating voltage $V_{CC}$ before it is applied to the second plate 12. Thus, the second plate 12 is electrically floating in the first state. After a predetermined period of time t, the control unit 22 outputs the floating voltage $V_{CC}$, which corresponds to the second state of the control unit 22. In the second state, the control unit 22 applies the floating voltage $V_{CC}$ to the first plate 10, which causes the first plate 10 to be electrically floating. The inverting buffer 24 inverts the floating voltage $V_{CC}$ to the ground signal GND before applying to the second plate 12, which grounds the second plate 12. After another predetermined period of time t, the control unit 22 switches back to outputting the ground signal GND. The control unit 22 continues to switch between outputting the ground signal GND and the floating voltage $V_{CC}$ each predetermined period of time t. In some example embodiments of the disclosed concept, the predetermined period of time t is significantly shorter than an RC time constant of the sensor system 1 when measuring DC voltage in the conductor 30. When measuring AC voltage in the conductor 30, switching may not be required. However, if switching is used when sensing AC voltage in the conductor 30, the predetermined period of time t should be significantly shorter than the period of the AC voltage.

Figure 7:
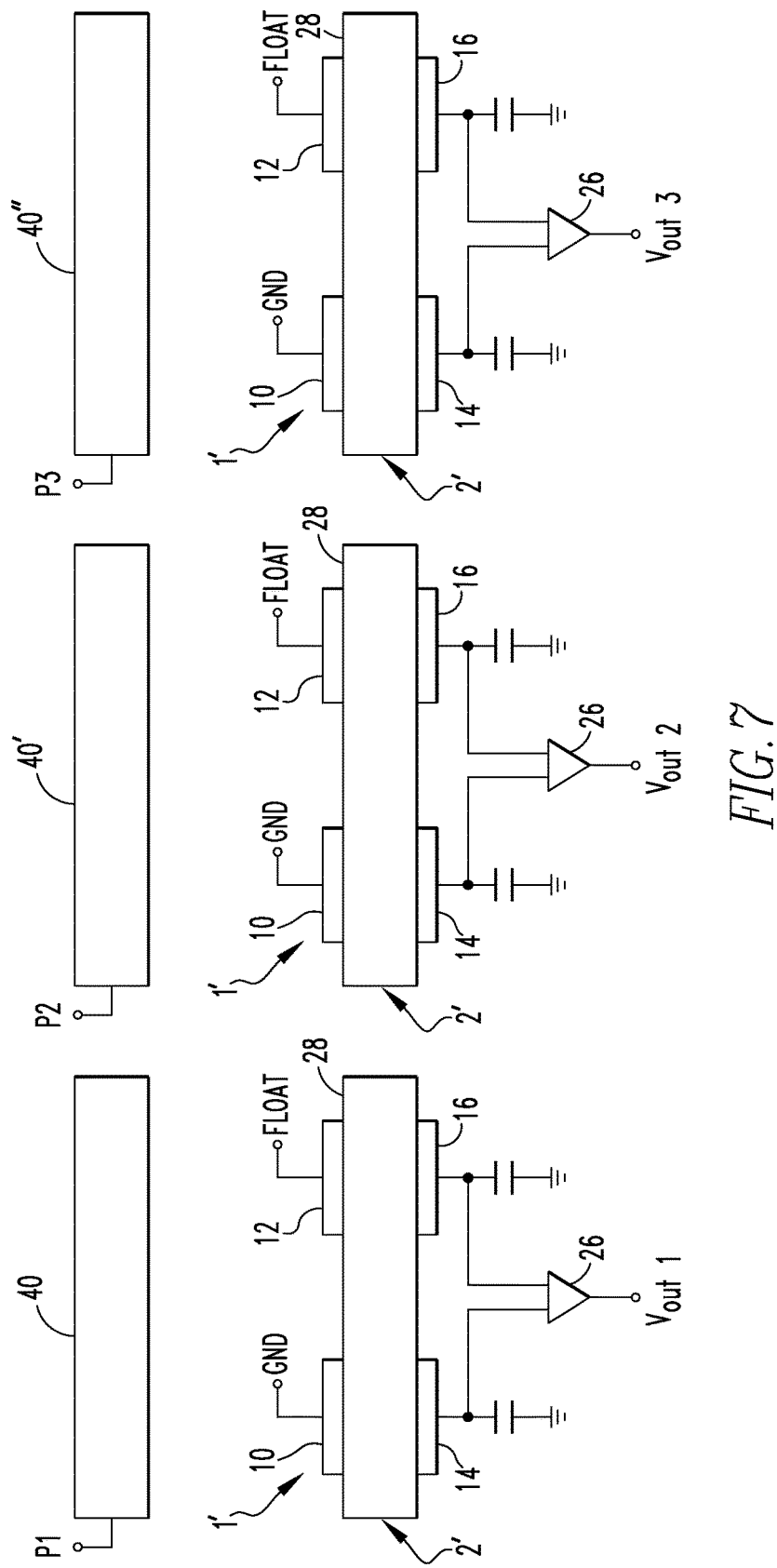
FIGS. 7 and 8 are a side views of sensor systems employed in conjunction with a three phase power system in accordance with another example embodiment of the disclosed concept.

FIG. 7 is a side view of the sensor system 1' of FIGS. 3 and 4 employed in conjunction with a three phase power system in accordance with another example embodiment of the disclosed concept.

The three phase power system includes first, second, and third conductors 40,40',40". The first conductor 40 is electrically connected to the first phase P1 of the power system, the second conductor 40' is electrically connected to the second phase P2 of the power system, and the third conductor 40" is electrically connected to the third phase P3 of the power system.

Three sensor systems 1' are employed, each one corresponding to a respective one of the three conductors 40,40', 40". Thus, the voltages of the conductors 40,40',40" can be determined from the output voltages $V_{OUT1}$, $V_{OUT2}$, $V_{OUT3}$ corresponding to the sensor systems 1'. Furthermore, the phases of the voltages of the conductors 40,40',40" can be determined from the output voltages $V_{OUT1}$, $V_{OUT2}$, $V_{OUT3}$ corresponding to the sensor systems 1'. Thus, the sensor systems 1' can be employed to monitor three phase power systems.

Although some of the circuitry associated with the sensors 2', such as the control unit 22 and the inverting buffer 24, is not shown in FIG. 7, it is contemplated that such circuitry may be included without departing from the scope of the disclosed concept. The sensor system 1' of FIGS. 3 and 4 is shown in FIG. 7, but it is contemplated that the sensor system 1 of FIGS. 1 and 2 may also be employed in conjunction with the three phase power system of FIG. 7 without departing from the scope of the disclosed concept.

Figure 8:
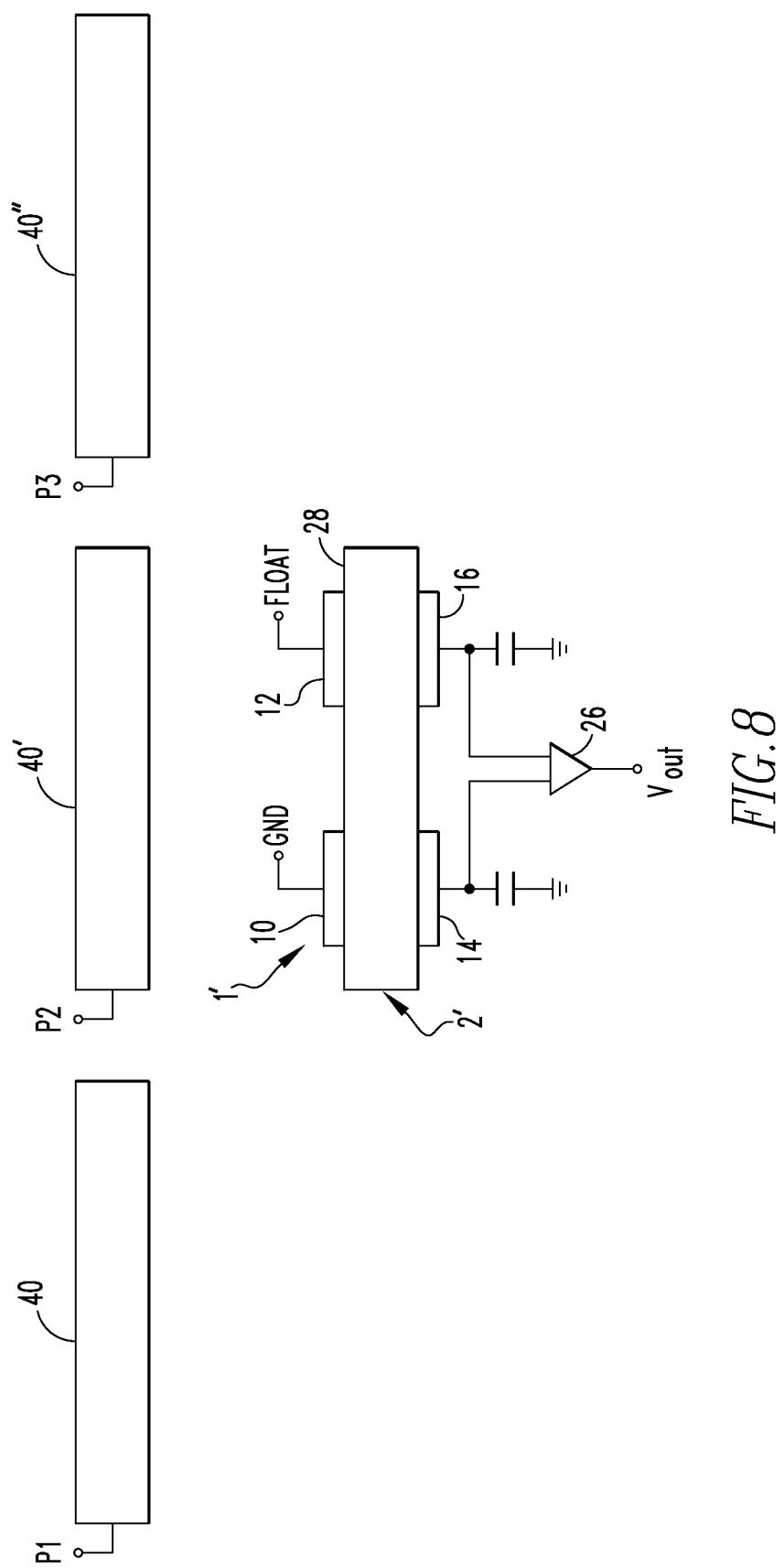

FIG. 8 is a side view of the sensor system 1' of FIGS. 3 and 4 employed in conjunction with a three phase power system in accordance with another example embodiment of the disclosed concept.

The three phase power system of FIG. 8, similar to the three phase power system shown in FIG. 7, includes first, second, and third conductors 40,40',40". The first conductor 40 is electrically connected to the first phase P1 of the power system, the second conductor 40' is electrically connected to the second phase P2 of the power system, and the third conductor 40" is electrically connected to the third phase P3 of the power system.

Rather than using three sensor systems 1' to sense the voltages in each of the conductors 40,40',40", the arrangement in FIG. 8. uses one sensor system 1' to sense the peak voltage in three conductors 40,40',40". The sensor system 1' provides the capability to sense the peak voltage and the frequency content (e.g., harmonics) in the three conductors 40,40',40" assuming that the conductors 40,40',40" are employed in a balanced system (i.e., equal phase voltages).

Although some of the circuitry associated with the sensors 2', such as the control unit 22 and the inverting buffer 24, is not shown in FIG. 8, it is contemplated that such circuitry may be included without departing from the scope of the disclosed concept. The sensor system 1' of FIGS. 3 and 4 is shown in FIG. 8, but it is contemplated that the sensor system 1 of FIGS. 1 and 2 may also be employed in conjunction with the three phase power system of FIG. 8 without departing from the scope of the disclosed concept.

Figure 9:
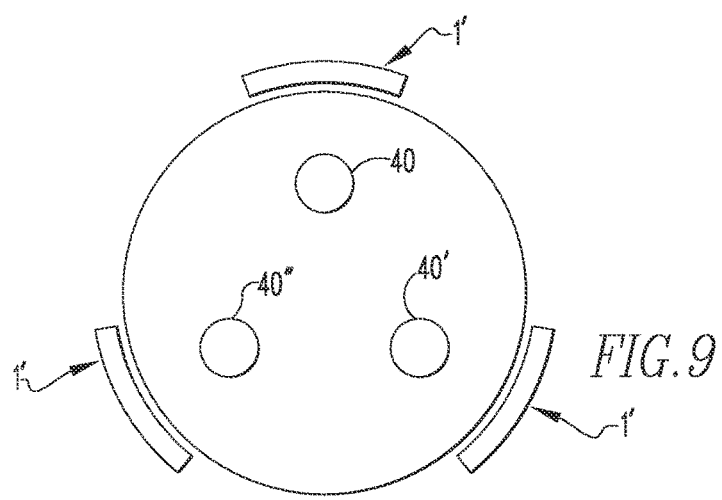
FIG. 9 is a simplified view of a sensor system employed in conjunction with a three phase power system in accordance with another example embodiment of the disclosed concept.

FIG. 9 is a simplified view of the sensor system 1' of FIGS. 3 and 4 employed in conjunction with a three phase power system in accordance with another example embodiment of the disclosed concept.

As shown in FIG. 9, three conductors 40,40',40" corresponding to the three phases of the power system are arranged in a triangular pattern. Three sensor systems 1' are employed. Each sensor system 1' corresponds to one of the conductors 40,40',40". The sensor systems 1' are disposed on the periphery of a circle around the conductors 40,40',40". Each sensor system 1' is located in the vicinity of its corresponding one of the conductors 40,40',40" so that it is closer to its corresponding conductor than to any of the other conductors 40,40',40". With this arrangement, the sensor system 1' can be used to conveniently sense voltages in a three phase power system whose conductors are carried in a single conduit.

The sensor system 1' of FIGS. 3 and 4 is shown in FIG. 9, but it is contemplated that the sensor system 1 of FIGS. 1 and 2 may also be employed in conjunction with the three phase power system of FIG. 9 without departing from the scope of the disclosed concept.

The sensor systems 1,1' disclosed herein do not require an electrical connection or physical contact with a conductor to sense the voltage of the conductor. Additionally, since the sensor systems 1,1' shown and described herein sense the voltage of the conductor based on the electric field induced by the conductor, the sensor systems 1,1' do not cause any power loss in the power passing through the conductor. Moreover, the sensor systems 1,1' have the capability to sense AC and DC voltage, and can be used over a wide voltage range.

Figure 10:
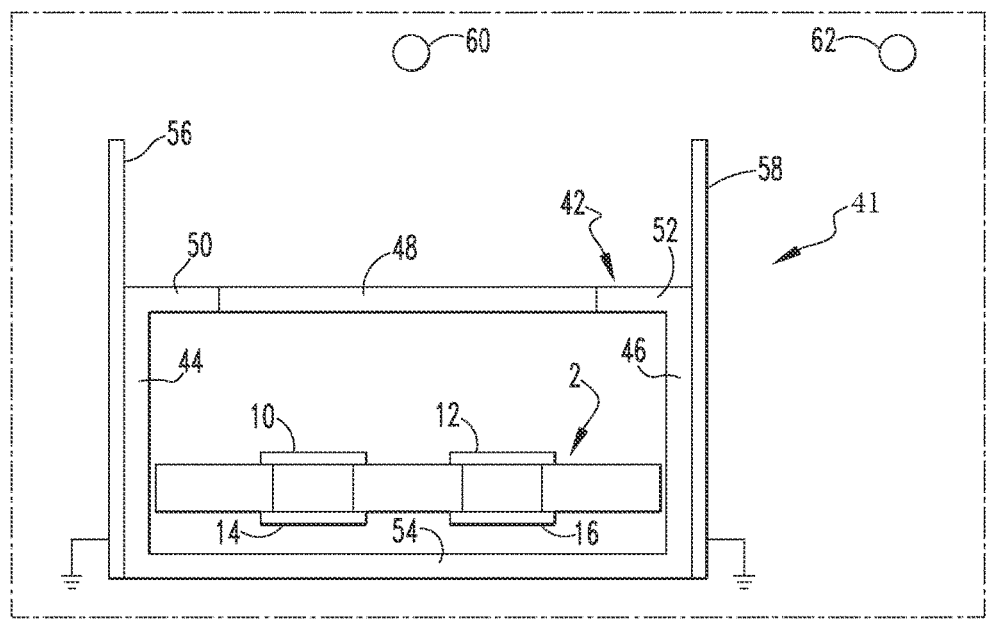
FIGS. 10 and 11 are cross-sectional view of sensor assemblies including housings in accordance with example embodiments of the disclosed concept.

FIG. 10 is a cross-sectional view of a sensor assembly in accordance with another example embodiment of the disclosed concept. The sensor assembly includes a sensor 2, such as the sensor 2 shown in FIG. 1. The sensor assembly also includes the circuitry associated with the sensor 2. The associated circuitry is shown in FIG. 1, but is not shown in FIG. 10. The sensor assembly also includes a housing 41.

The housing 41 includes an enclosed portion 42. The enclosed portion includes sides 44,46, a top 48,50,52, and a bottom 54. Together, the sides 14,46, top 48,50,52, and bottom 54 define an interior space. The sensor 2 is disposed in the interior space. The enclosed portion 42 may be sealed so that the interior space is in a vacuum.

The top 48,50,52 of the enclosed portion includes a conductive top portion 48 and remainder portions 50,52. The conductive top portion 48 is conductive and is electrically floating. This allows electric fields to pass through it. The remainder top portions 50,52, the sides 44,46, and the bottom 54 of the enclosed portion 42 are made of a different material. In some example embodiments of the disclosed concept, the remainder top portions 50,52, the sides 44,46, and the bottom 54 of the enclosed portion 42 are made of a non-conductive material. In some example embodiments of the disclosed concept, the remainder top portions 50,52, the sides 44,46, and the bottom 54 of the enclosed portion 42 are made of, without limitation, ceramic, plastic, elastomer, or epoxy.

The housing 41 also includes conductive side portions 56,58. The conductive side portions 56,58 are disposed adjacent to the sides 44,46 of the enclosed portion 42. The conductive side portions 56,58 are electrically grounded which prevents electric fields from passing through them.

The sensor assembly of FIG. 10 is effective in shielding the sensor 2 from nearby conductors. For example, as shown in FIG. 10 the sensor assembly is disposed directly below a first conductor 60. The electric field from the first conductor 60 is able to pass through the floating conductor to the sensor 2 without being blocked by the conductive side portions 56,58. Thus, the sensor 2 is able to sense the voltage in the first conductor 60. A second conductor 62 is disposed a lateral distance from the first conductor 60. Ordinarily, an electric field from the second conductor 62 could reach the sensor 2 and reduce the accuracy of the sensor's 2 voltage reading of the first conductor 60. However, the conductive side portions 56,58, which are grounded, block the electric field from the second conductor 62 from reaching the sensor 2. Thus, the sensor 2 can accurately sense the voltage in the first conductor 60 without interference from the electric field of the second conductor 62.

Figure 11:
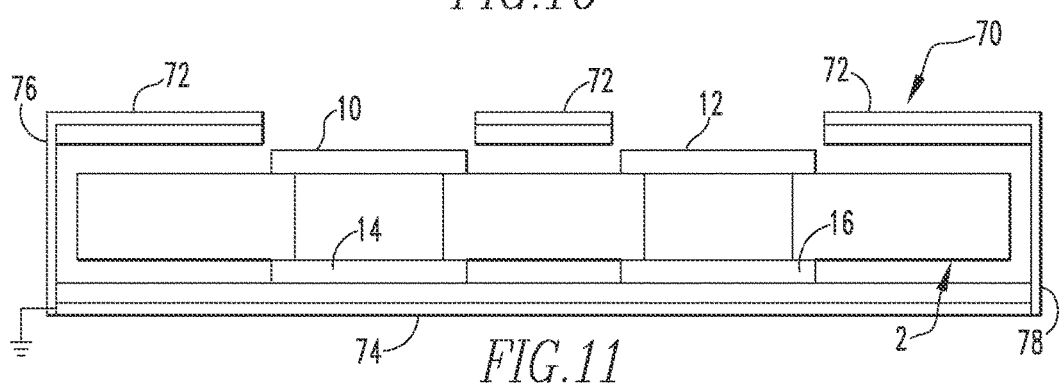

FIG. 11 is a cross-sectional view of a sensor assembly in accordance with another example embodiment of the disclosed concept. The sensor assembly includes a sensor 2, such as the sensor 2 shown in FIG. 1. The sensor assembly also includes the circuitry associated with the sensor 2. The associated circuitry is shown in FIG. 1, but is not shown in FIG. 11. The sensor assembly also includes a housing 70.

The housing 70 includes a conductive top 72, a conductive bottom 74, and conductive sides 76,78. The conductive top 72, bottom 74, and sides 76,78 define an interior area. The sensor 2 is disposed in the interior area. The conductive top 72, bottom 74, and sides 76,78 are electrically grounded which prevents electric fields from passing through them.

The conductive top 78 has two openings formed in it. The openings correspond to the first and second plates 10,12 of the sensor 2. The openings have a similar shape as the first and second plates 10,12 and are slightly larger than the first and second plates 10,12. The openings allow electric fields from above the sensor 2 to reach the interior space, and in particular, to reach the first and second plates 10, 12 and the first and second electrodes 14,16.

The sensor assembly allows the sensor 2 to sense the voltage of a conductor disposed above the sensor assembly. The conductive top 72, bottom 74, and sides 76,78 of the housing also block electric fields that originate from other directions. This allows the sensor 2 to accurately sense the voltage in the conductor by reducing general noise and interference from other nearby conductors.

While the sensor 2 of FIGS. 1-3 is disclosed in use with the housings 41,70 of FIGS. 10 and 11, it is contemplated that the sensor 2 may similarly be employed in conjunction with the housings 41,70 of FIGS. 10 and 11.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A voltage sensor system for sensing voltage in a conductor, the voltage sensor system comprising:
   a first plate;
   a first electrode corresponding to and disposed a first distance away from the first plate;
   a second plate;
   a second electrode corresponding to and disposed a second distance away from the second plate;
   a control unit structured to control one of the first plate and the second plate to be grounded and the other of the first plate and the second plate to be electrically floating;
   an inverting buffer electrically connected between the control unit and the second plate; and a differential amplifier electrically connected to the first electrode and the second electrode and being structured to output an output voltage that is proportional to a difference in voltage between the first electrode and the second electrode, wherein the control unit includes an output that is directly electrically coupled to the first plate and is electrically coupled to the second plate via the inverting buffer such that a single signal provided at the output of the control unit controls both one of the first plate and the second plate to be grounded and the other of the first plate and the second plate to be electrically floating.

2. The voltage sensor system of claim 1, wherein the control unit has a first state in which it controls the first plate to be grounded and the second plate to be electrically floating, and a second state in which it controls the first plate to be electrically floating and the second plate to be grounded.

3. The voltage sensor system of claim 2, wherein the control unit is structured to switch between the first state and the second state after a predetermined period of time.

4. The voltage sensor system of claim 1, wherein the single signal provided at the output of the control unit is a square wave.

5. The voltage sensor system of claim 1, wherein the first distance and the second distance are substantially equal.

6. The voltage sensor system of claim 1, further comprising:
a number of spacers structured to space the first plate and the first electrode the first distance apart and to space the second plate and the second electrode the second distance apart.

7. The voltage sensor system of claim 6, wherein the spacers are non-conductive.

8. The voltage sensor system of claim 1, wherein the first plate and the first electrode are separated by a first air gap and the second plate and the second electrode are separated by a second air gap.

9. The voltage sensor system of claim 1, wherein the first plate and the first electrode and the second plate and the second electrode are separated by a dielectric material.

10. The voltage sensor system of claim 1, wherein the first plate and the second plate are coplanar; and wherein the first electrode and the second electrode are coplanar.

11. The voltage sensor system of claim 1, wherein the first plate is disposed between the conductor and the first electrode and the second plate is disposed between the conductor and the second electrode.

12. The voltage sensor system of claim 1, wherein the first plate and the second plate are disposed a distance away from the conductor.

13. The voltage sensor system of claim 1, wherein the voltage sensor system is not in physical contact with the conductor.

14. The voltage sensor system of claim 1, wherein voltage in the conductor induces electric field; and wherein the one of the first and second plates that is grounded shields its associated electrode from the electric field; and wherein the electric field passes through the one of the first and second plates that is not grounded and induces voltage in its associated electrode.

15. The voltage sensor system of claim 1, wherein the first plate and the first electrode are aligned parallel with each other and/or the second plate and the second electrode are aligned parallel with each other.

16. A voltage sensor system for sensing voltages in a three phase power system including a first conductor corresponding to a first phase, a second conductor corresponding to a second phase, and a third conductor corresponding to a third phase, the voltage sensor system comprising:
a first sensor system corresponding to the first conductor;
a second sensor system corresponding to the second conductor; and
a third sensor system corresponding to the third conductor,
wherein each of the first, second, and third sensor systems includes:
a first plate;
a first electrode disposed a first distance away from the first plate;
a second plate;
a second electrode disposed a second distance away from the second plate;
a control unit structured to control one of the first plate and the second plate to be grounded and the other of the first plate and the second plate to be electrically floating;
an inverting buffer electrically connected between the control unit and the second plate; and
a differential amplifier electrically connected to the first electrode and the second electrode and being structured to output an output voltage that is proportional to a difference in voltage between the first electrode and the second electrode,
wherein the control unit includes an output that is directly electrically coupled to the first plate is electrically coupled to the second plate via the inverting buffer such that a single signal provided at the output of the control unit controls both one of the first plate and the second plate to be grounded and the other of the first plate and the second plate to be electrically floating.

17. A method of sensing voltage in a conductor, the method comprising: providing a first plate; providing a first electrode corresponding to and disposed a first distance away from the first plate; providing a second plate; providing a second electrode corresponding to and disposed a second distance away from the second plate; providing an inverting buffer electrically connected between the control unit and the second plate; providing a control unit that includes an output that is directly electrically coupled to the first plate and is electrically coupled to the second plate via the inverting buffer such that a single signal provided at the output of the control unit controls both one of the first plate and the second plate to be grounded and the other of the first plate and the second plate to be electrically floating; controlling one of the first plate and the second plate to be grounded and the other of the first plate and the second plate to be electrically floating using the single signal; and sensing a voltage difference between the first electrode and the second electrode.

18. The method of claim 17, further comprising:
switching between a first state and a second state, wherein the first state includes controlling the first plate to be grounded and the second plate to be electrically floating, and wherein the second state includes controlling the second plate to be grounded and the first plate to be electrically floating.

19. The method of claim 18, further comprising:
waiting a predetermined time before switching between the first and second states.

* * * * *